United States Patent
Soeda et al.

(10) Patent No.: US 11,313,746 B2
(45) Date of Patent: Apr. 26, 2022

(54) PRESSURE SENSOR HAVING A SURFACE OF A DIAPHRAGM HELD IN A CHEMICALLY INACTIVE STATE

(71) Applicant: AZBIL CORPORATION, Chiyoda-ku (JP)

(72) Inventors: Masaru Soeda, Chiyoda-ku (JP); Takuya Ishihara, Chiyoda-ku (JP); Masashi Sekine, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 13 days.

(21) Appl. No.: 16/918,508

(22) Filed: Jul. 1, 2020

(65) Prior Publication Data
US 2021/0003467 A1 Jan. 7, 2021

(30) Foreign Application Priority Data
Jul. 2, 2019 (JP) .............................. JP2019-123534

(51) Int. Cl.
*G01L 9/06* (2006.01)
*G01L 19/14* (2006.01)
(Continued)

(52) U.S. Cl.
CPC .............. *G01L 9/06* (2013.01); *G01L 9/0072* (2013.01); *G01L 9/08* (2013.01); *G01L 19/147* (2013.01); *H01L 41/1132* (2013.01)

(58) Field of Classification Search
None
See application file for complete search history.

(56) References Cited

U.S. PATENT DOCUMENTS 5,693,887 A   12/1997  Englund et al.
6,132,513 A *  10/2000  Kadkhodayan ....... G01L 9/0042
                                                     118/715
(Continued)

FOREIGN PATENT DOCUMENTS

JP    2001-149946 A    6/2001
JP    2009-524024 A    6/2009
(Continued)

OTHER PUBLICATIONS

Other Action dated Jul. 20, 2021 in corresponding Korean Patent Application No. 10-2020-0068364 (with English Translation), 4 pages.
(Continued)

*Primary Examiner* — Peter J Macchiarolo
*Assistant Examiner* — Jermaine L Jenkins
(74) *Attorney, Agent, or Firm* — Oblon, McClelland, Maier & Neustadt, L.L.P.

(57) ABSTRACT

A pressure sensor includes a movable electrode formed in a movable region of a diaphragm, and a fixed electrode formed opposite to the movable electrode. A pressure receiving surface of the diaphragm is held in an inactive state. The inactive pressure receiving surface of the diaphragm is in a state in which molecules of gas to be measured are hard to absorb onto the pressure receiving surface. The pressure receiving surface of the diaphragm can be made inactive by predetermined surface treatment. A layer for making the pressure receiving surface of the diaphragm inactive is formed by the surface treatment, and the pressure receiving surface of the diaphragm is held inactive with the presence of the layer.

8 Claims, 5 Drawing Sheets

(51) Int. Cl.
*H01L 41/113* (2006.01)
*G01L 9/08* (2006.01)
*G01L 9/00* (2006.01)

(56) References Cited

U.S. PATENT DOCUMENTS

| | | | |
|---|---|---|---|
| 9,170,166 B2* | 10/2015 | Pan | G01L 9/0095 |
| 2007/0089524 A1* | 4/2007 | Walchli | G01L 9/0079 |
| | | | 73/718 |
| 2010/0233353 A1* | 9/2010 | Martini | C23C 14/12 |
| | | | 427/8 |
| 2014/0150559 A1* | 6/2014 | Ishihara | G01L 19/147 |
| | | | 73/718 |
| 2014/0318656 A1* | 10/2014 | Gu | F15D 1/0005 |
| | | | 138/37 |
| 2018/0259409 A1* | 9/2018 | Sekine | G01L 9/125 |
| 2020/0386635 A1* | 12/2020 | Zhang | G01L 11/025 |
| 2020/0399119 A1* | 12/2020 | Yang | B81C 1/00158 |

FOREIGN PATENT DOCUMENTS

| | | |
|---|---|---|
| JP | 2010-236949 A | 10/2010 |
| JP | 5054931 A | 10/2012 |
| JP | 2014-109484 A | 6/2014 |
| JP | 2014-126504 A | 7/2014 |
| JP | 2015-034786 A | 2/2015 |
| JP | 2016-526153 A | 9/2016 |
| JP | 2018-146530 A | 9/2018 |
| KR | 10-0523970 B1 | 10/2005 |
| WO | WO 02/08713 A1 | 1/2002 |

OTHER PUBLICATIONS

Combined Chinese Office Action and Search Report dated Sep. 3, 2021 in Patent Application No. 202010553359.7 (with English language translation and English translation of Category of Cited Documents), 15 pages.

* cited by examiner

PRESSURE SENSOR HAVING A SURFACE OF A DIAPHRAGM HELD IN A CHEMICALLY INACTIVE STATE

CROSS-REFERENCE TO RELATED APPLICATIONS

The present application is based on and claims priority to Japanese Application No. 2019-123534, filed Jul. 2, 2019, the entire contents of which are incorporated herein by reference.

BACKGROUND

1. Field

The present disclosure relates to a pressure sensor.

2. Description of the Related Art

A pressure sensor outputting a pressure value in accordance with a flexural deformation, namely a displacement, of a diaphragm under pressure, for example, is widely utilized in semiconductor equipment and other industrial fields. Various types of film forming apparatuses based on vapor deposition, and dry etching apparatuses are used in manufacturing of semiconductor devices. In those manufacturing apparatuses, the pressure in a processing chamber, the partial pressure of process gas, and so on are accurately controlled to form a thin film with a nm-size thickness, and hence accurate pressure measurement is important. The pressure sensor is used to perform such pressure measurement.

The above-mentioned type of pressure sensor is required to have not only corrosion resistance to gases used in the apparatuses, such as the process gas, but also resistance to byproducts that are generated in processes such as film formation. Furthermore, in a film formation process, useless deposits generate at various locations through which the process gas passes, including an inner wall of a film formation chamber, inner walls of pipes, the inside of a vacuum pump, and a diaphragm that is a pressure receiving portion of the pressure sensor, and the deposits cause various problems.

There is, for example, atomic layer deposition (ALD) that has recently been developed as being superior in step coverage and film quality to chemical vapor deposition (CVD) generally used so far, and that is utilized to form, for example, a gate insulating film. In the ALD, due to specific characteristics, material gas tends to adhere and the above-mentioned useless deposits tend to generate at various locations through which the material gas passes. As well known, if the useless deposit generates on the diaphragm of the pressure sensor, the deposit causes a shift of zero point and a change of pressure sensitivity and impedes accurate measurement, thus significantly affecting the processing result.

In a film forming operation, for example, various components are heated to about 200° C., for example, in order to prevent the generation of the above-mentioned useless deposit on the diaphragm. There are also proposed techniques of making a path of the process gas until reaching the diaphragm complicated with the provision of a baffle, for example, capturing the useless deposit midway the path, and preventing the generation of the above-mentioned useless deposit on the diaphragm (see Japanese Unexamined Patent Application Publication No. 2001-149946, Japanese Unexamined Patent Application Publication (Translation of PCT application) No. 2016-526153, and Japanese Unexamined Patent Application Publication No. 2015-034786). In other proposed techniques, a position on the diaphragm where the process gas reaches is designed to locate not in a central portion of the diaphragm where the influence of the deposit is significant, but in a peripheral portion of the diaphragm (see Japanese Unexamined Patent Application Publication No. 2001-149946, Japanese Unexamined Patent Application Publication (Translation of PCT application) No. 2016-526153, Japanese Unexamined Patent Application Publication No. 2014-126504, and Japanese Unexamined Patent Application Publication No. 2014-109484).

In addition, a diaphragm structure is proposed in which the rigidity of the diaphragm is adjusted to suppress a flexure of the diaphragm for adaptation to the ALD (see Japanese Unexamined Patent Application Publication No. 2010-236949). There is further proposed a technique of forming a surface of the diaphragm as a structured surface in the form of a lattice mesh, for example, thus greatly reducing bending stress that is caused by a material of a measured medium deposited on the diaphragm (see, Japanese Unexamined Patent Application Publication (Translation of PCT application) No. 2009-524024).

Nowadays, however, a higher-accurate process is demanded in step with further uniformity in film thickness and quality. In such a situation, the above-described related-art techniques cannot completely prevent a trace amount of deposit from being generated on the diaphragm, and cannot completely eliminate stress (film stress) exposed on the diaphragm due to the deposit. A decrease of accuracy in the pressure measurement resulting from the above-mentioned deposit and stress is not negligible.

SUMMARY

In consideration of the above-described problem, an object of the present disclosure is to more reliably reduce the influence caused by a deposit on a diaphragm of a pressure sensor.

A pressure sensor according to the present disclosure includes a diaphragm that is displaceable and receives, at a pressure receiving surface, pressure of gas to be measured, and a measurement portion that measures a displacement of the diaphragm, the pressure receiving surface of the diaphragm being held in a chemically inactive state.

In an example of the pressure sensor described above, the pressure receiving surface of the diaphragm is in a state in which molecules of the gas are hard to absorb onto the pressure receiving surface.

In an example of the pressure sensor described above, the pressure receiving surface of the diaphragm is held in the chemically inactive state with a layered substance formed on the pressure receiving surface.

In an example of the pressure sensor described above, the pressure receiving surface of the diaphragm is held in the chemically inactive state with surface termination molecules formed at the pressure receiving surface.

In an example of the pressure sensor described above, the measurement portion includes a movable electrode formed in a movable region of the diaphragm and a fixed electrode formed opposite to the movable electrode, and the measurement portion measures the displacement of the diaphragm by measuring a capacitance between the movable electrode and the fixed electrode.

In an example of the pressure sensor described above, the measurement portion includes a reflective film and a semi-reflective film that are formed in a movable region of the diaphragm and an immovable region opposite to each other, and the measurement portion optically measures the displacement of the diaphragm.

In an example of the pressure sensor described above, the measurement portion includes a piezo resistance region formed in the diaphragm, and the pressure sensor measures the displacement of the diaphragm by measuring a distortion of the diaphragm.

With the above-described features, the present disclosure can more reliably reduce the influence caused by a deposit on the diaphragm of the pressure sensor.

DETAILED DESCRIPTION

Figure 1:
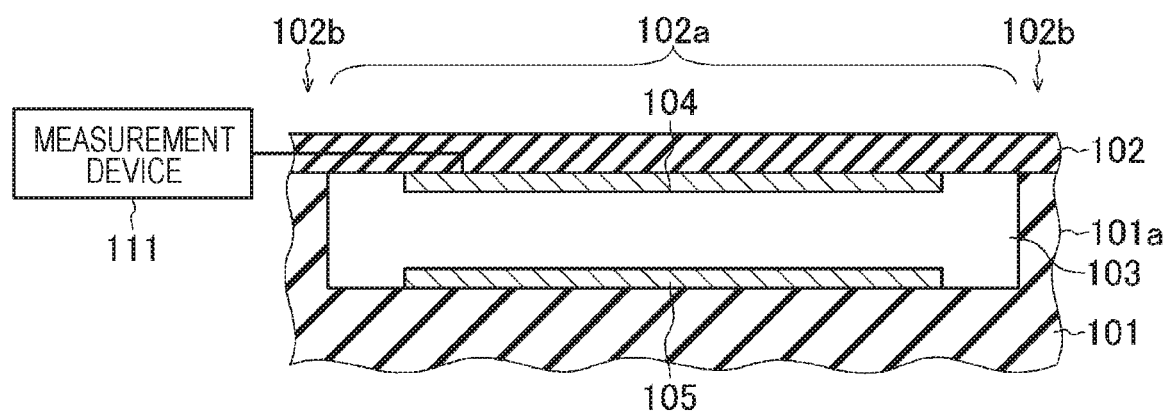
FIG. 1 is a sectional view illustrating a structure of a pressure sensor according to an embodiment of the present disclosure.

A pressure sensor according to an embodiment of the present disclosure will be described below with reference to FIG. 1. The pressure sensor includes a diaphragm 102 that is displaceable and has a pressure receiving surface subjected to the pressure of gas to be measured, and a measurement portion that is constituted to measure a displacement of the diaphragm. The measurement portion of the pressure sensor includes a movable electrode 104 formed in a movable region 102a of the diaphragm 102, and a fixed electrode 105 formed opposite to the movable electrode 104. The pressure sensor is the so-called capacitive pressure sensor.

The diaphragm 102 is supported on a base 101 made of an insulator by a support portion 101a, and is arranged such that the movable region 102a is spaced from the base 101. The diaphragm 102 is bonded to an upper surface of the support portion 101a in a bonding region 102b on the outer side of the movable region 102a. Furthermore, the diaphragm 102 is displaceable in the movable region 102a in a direction toward the base 101 and receives pressure from the gas to be measured.

An airtight chamber 103 is formed between the diaphragm 102 in the movable region 102a and the base 101, and the movable electrode 104 and the fixed electrode 105 are arranged inside the airtight chamber 103. As well known, the capacitive pressure sensor measures pressure, received at a pressure receiving region of the diaphragm 102, based on change of a capacitance formed between the movable electrode 104 and the fixed electrode 105. The change of the capacitance formed between the movable electrode 104 and the fixed electrode 105 is converted to a pressure value by a measurement device 111 in accordance with preset sensor sensitivity, and is then output.

Alternatively, the pressure sensor may have a structure including a first electrode pair made up of a movable electrode formed in a movable region of the diaphragm and a first fixed electrode formed opposite to the movable electrode, and a second electrode pair made up of an immovable electrode formed in an immovable region of the diaphragm and a second fixed electrode formed opposite to the immovable electrode. That type of pressure sensor measures a value based on a difference between a capacitance of the first electrode pair and a capacitance of the second electrode pair.

In the pressure sensor according to this embodiment, the pressure receiving surface of the diaphragm 102 is held in a chemically inactive state. Thus the pressure receiving surface of the diaphragm 102 is in a state in which molecules of the gas to be measured and other gases, including residues and gases generated in the process, are hard to adsorb onto the pressure receiving surface. The pressure receiving surface of the diaphragm 102 can be brought into the inactive state with predetermined surface treatment. A layer for making the pressure receiving surface of the diaphragm 102 inactive is formed by the surface treatment, and the pressure receiving surface of the diaphragm 102 is held inactive with the presence of such a layer.

For example, the pressure receiving surface of the diaphragm 102 can be brought into the inactive state by forming a several-molecular coating layer made of a layered material with the surface treatment. This case creates a state in which the layer of the layered substance is formed on the pressure receiving surface of the diaphragm 102.

Alternatively, the pressure receiving surface of the diaphragm 102 can also be brought into the inactive state by performing the surface treatment so as to terminate (dangling bonds) in the pressure receiving surface of the diaphragm 102 with surface termination molecules. This case creates a state in which the surface termination molecules are formed at the inactive pressure receiving surface of the diaphragm 102.

Figure 2A:
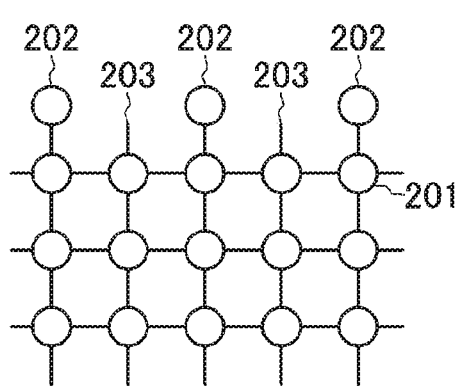
FIGS. 2A and 2B are each an explanatory view referenced to explain a state of atomic arrangement in a substance surface.

As well known, atomic arrangement is incomplete at a substance surface. As illustrated in FIG. 2A, for example, at a surface of a substance made up of atoms 201, atomic arrangement is incomplete and there are surface atoms 202 and dangling bonds 203. In areas of the dangling bonds 203, because of the absence of atoms that are to be inherently bonded, actions exerted on the surface atoms 202 from nearby atoms and ions are more uneven than those exerted on the internal atoms 201. Furthermore, surface atomic defects are also present in the substance surface in some cases. From those reasons, energy (surface free energy) of the surface atoms 202 is high unlike the internal atoms 201, and an energy potential of the surface atoms 202 is in an instable (active) state.

Figure 2B:
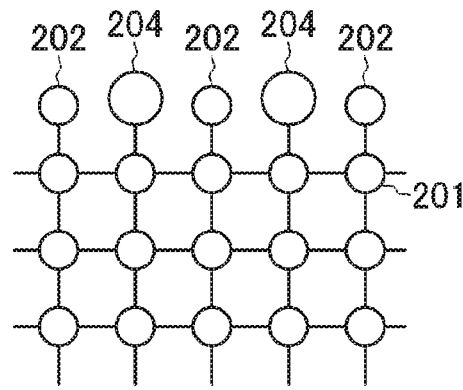

Reactivity of the dangling bonds 203 is very high and causes a strong reaction upon phenomena such as crystal growth. Therefore, the dangling bonds 203 present in the substance surface are supposed to promote adsorption of foreign molecules coming closer to them. Moreover, as illustrated in FIG. 2B, foreign molecules 204 and others forming the gases are adsorbed onto the dangling bonds 203, whereby the substance surface is reconstructed and brought into a stable state in many cases. However, when an environment to which the substance surface is exposed comes under negative pressure, for example, a vacuum state, or when temperature of the environment increases, there is a high possibility that the adsorbed molecules are dissociated, the dangling bonds 203 appear at the substance surface again, and the substance surface turns to an active state.

Here, whether other atoms are adsorbed onto the surface atoms 202 presumably depends on not only the number of the dangling bonds 203, but also the crystal structure of the substance, the molecular polarity, and so on. In general, however, it is thought that whether the substance surface is active or not (namely, whether a level of surface potential energy is high or low) affects adsorption of other atoms and molecules onto the substance surface. Accordingly, the adsorption of foreign matters onto the substance surface can be avoided when the substance surface is in the inactive state.

Figure 3:
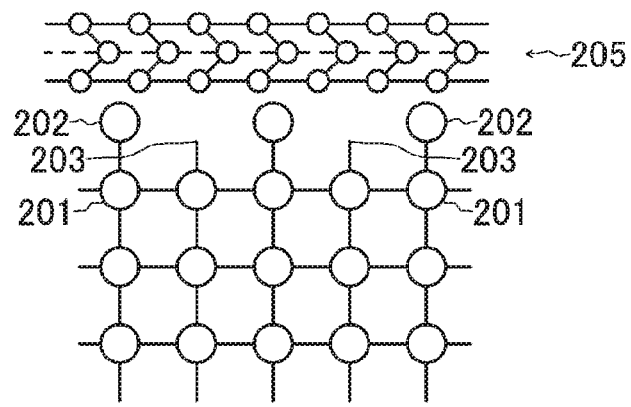
FIG. 3 illustrates a state in which a layered substance is formed on the substance surface.

As illustrated in FIG. 3, for example, the substance surface can be brought into the inactive state by forming a several-molecular coating layer made of a layered material 205 on the substance surface constituted by the atoms 201 where the surface atoms 202 and the dangling bonds 203 are present. In the layered substance, as well known, different layers are bonded to each other by weak van der Waals force. Moreover, the dangling bonds are less likely to appear at a cleavage plane of the layered substance. Thus, by terminating the substance surface with the layered substance having the above-mentioned properties, the substance surface can be brought into the inactive state, and adsorption of foreign matters can be avoided even when the foreign matters come close.

In an example, the layered substance made of graphite, graphene, P, As, Sb, or Bi can be used. In another example, the layered substance made of transition metal dichalcogenide, such as $MCh_2$ (M=Ti, Zr, Hf, V, Nb, Ta, Mo, or W, and Ch=S, Se or Te), can be used. In still another example, the layered substance made of group 13 chalcogenide, such as GaS, GaSe, GaTe, or InSe, can be used. In still another example, the layered substance made of group 14 chalcogenide, such as GeS, $SnS_2$, $SnSe_2$, or PbO, can be used. In still another example, the layered substance made of bismuth chalcogenide, such as $Bi_2Se_3$ or $Bi_2Te_3$, can be used.

In still another example, the layered substance made of a divalent metal hydroxide, such as $M(OH)_2$ (M=Mg, Ca, Mn, Fe, Co, Ni, Cu or Cd), can be used. In still another example, the layered substance made of a metal halide, such as $MgBr_2$, $CdCl_2$, $CdI_2$, $Ag_2F$, $AsI_3$ or $AlCl_3$, can be used. In still another example, the layered substance made of a layered silicate, a layered oxide, a titanium oxide, a perovskite nanosheet, or a niobate oxide [such as $MoO_3$, $WO_3$, $TiO_2$, $MnO_2$, $V_2O$, $TaO_3$, $RuO_2$, $LaNb_2O_7$, $(Ca,Sr)_2Nb_3O_{10}$, $Bi_4Ti_3O_{12}$, $Ca_2Ta_2TiO_{10}$] can be used. The surface treatment to form the above-mentioned layered substance can be performed with CVD, ALD, sputtering, or molecular beam epitaxy.

Furthermore, deactivation of the substance surface can be realized by using a molecular layer in which molecular chains terminated with, for example, fluorine or fluorine compounds acting to lower activation energy continuously extend in a direction perpendicular to a planar direction of the substance surface. The dangling bonds can be terminated with those molecular chains (surface termination molecules).

Figure 4:
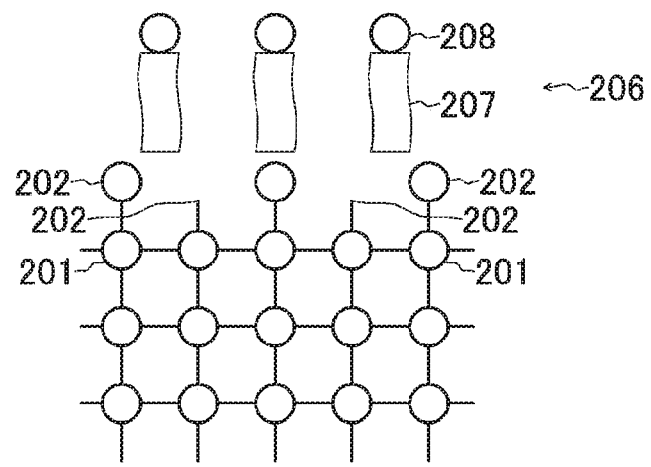
FIG. 4 illustrates a state in which a self-organizing monomolecular layer is formed on the substance surface.

As illustrated in FIG. 4, for example, the substance surface can be brought into the inactive state by forming a self-organizing monomolecular layer 206 on the substance surface constituted by the atoms 201 where the surface atoms 202 and the dangling bonds 203 are present. The self-organizing monomolecular layer 206 is constituted by a plurality of molecular chains 207 having uniform orientation, and terminal atoms 208 terminating the molecular chains 207. Alternatively, the molecular chains 207 may be in the form of oriented nanotubes. That type of layer has a very thin thickness of several nanometers or less, and the surface treatment can be performed after fabricating the pressure sensor.

Examples of the self-organizing monomolecular layer are thiol-, silane-, and acetate-based monomolecular layers. These self-organizing monomolecular layers can be formed by, for example, contacting a solution or vapor of molecules having reaction activity with a surface to be treated. In other words, the self-organizing monomolecular layer can be formed on the substance surface with solution treatment or gas-phase treatment by utilizing a chemical reaction such as an acid-base reaction or a silane coupling reaction.

An example of the oriented nanotube is a carbon nanotube (fluorine-functionalized oriented carbon nanotube).

The surface treatment for the above-described inactivation is applied to the pressure receiving surface of the diaphragm 102, the surface being exposed to the gas to be measured, and can be performed after fabricating the pressure sensor. In addition, the surface treatment causes no influences upon an electrical output portion of the pressure sensor. It is, therefore, also possible to dismount the pressure sensor that is already in actual use, and to perform the surface treatment on the dismounted pressure sensor.

Figure 5:
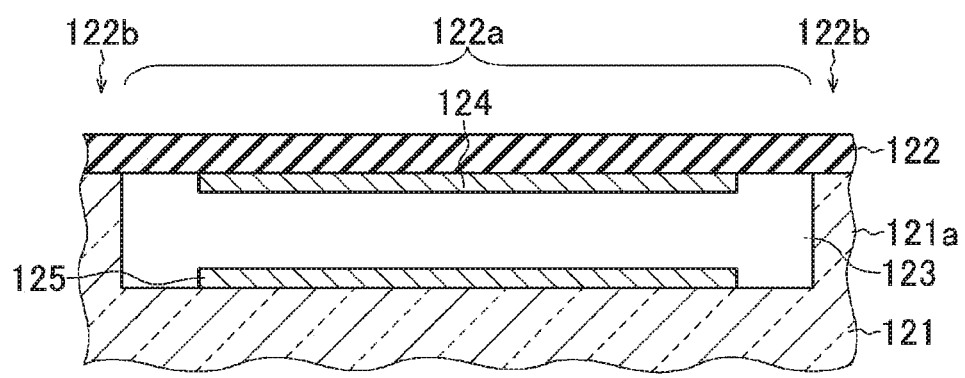
FIG. 5 is a sectional view illustrating a structure of another pressure sensor according to the embodiment of the present disclosure.

The pressure sensor may be a pressure sensor including a measurement portion that optically measures the displacement of the diaphragm. That type of pressure sensor will be described with reference to FIG. 5. The pressure sensor includes a base 121 and a diaphragm 122 supported by a support portion 121a of the base 121. The diaphragm 122 is displaceable and receives, at a pressure receiving surface, the pressure of the gas to be measured. The diaphragm 122 is bonded to an upper surface of the support portion 121a in a bonding region 122b on the outer side of a movable region 122a, and is arranged such that the movable region 122a is spaced from the base 121. The base 121 is made of an optically transparent material.

A measurement portion of this pressure sensor includes a reflective film 124 formed in the movable region 122a of the diaphragm 122, and a semi-reflective film 125 formed opposite to the reflective film 124. The measurement portion further includes a light source (not illustrated) that outputs first signal light and second signal light, and an interference measurement unit (not illustrated). An airtight chamber 123 is formed between the diaphragm 122 in the movable region 122a and the base 121, and the reflective film 124 and the semi-reflective film 125 are arranged inside the airtight chamber 123. The signal lights emitted from the light source can be guided to a target location through an optical fiber, for example.

In this pressure sensor, the pressure receiving surface of the diaphragm 122 is held in an inactive state. Thus the pressure receiving surface of the diaphragm 122 is in a state in which molecules of the gas to be measured are hard to adsorb onto the pressure receiving surface. The pressure receiving surface of the diaphragm 122 can be brought into the inactive state with predetermined surface treatment. A layer for making the pressure receiving surface of the diaphragm 122 inactive is formed by the surface treatment, and the pressure receiving surface of the diaphragm 122 is held in the inactive state with the presence of such a layer. The above-mentioned point is similar to that described in the above embodiment.

In this pressure sensor, a first reflected light is obtained by applying the first signal light emitted from the light source to pass through the base 121 and the semi-reflective film 125 and then to be reflected by the reflective film 124. A second reflected light is obtained by applying the second signal light emitted from the light source to pass through the base 121 and then to be reflected by the semi-reflective film 125. The displacement of the diaphragm on which the reflective film 124 is formed can be measured by observing interference between the first reflected light and the second reflected light, which have been obtained as described above, with the interference measurement unit.

Figure 6:
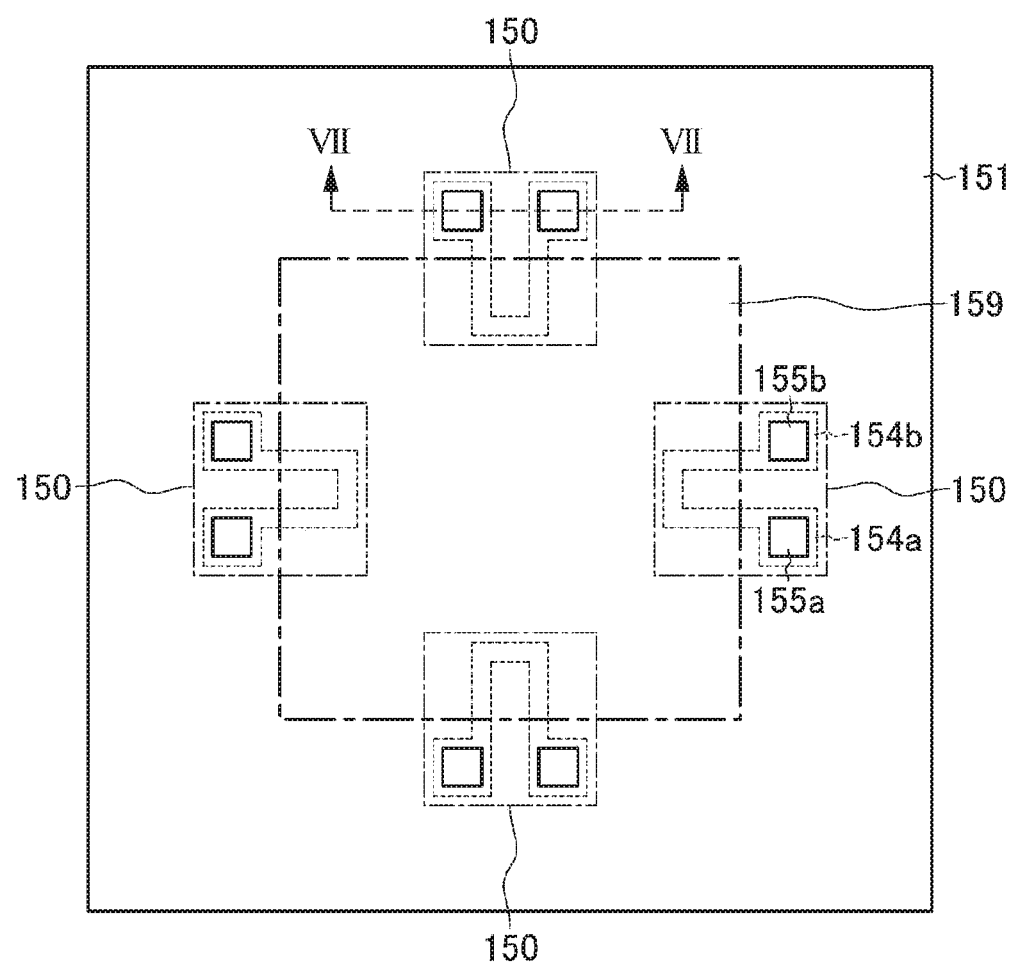
FIG. 6 is a plan view illustrating a structure of part of still another pressure sensor according to the embodiment of the present disclosure.
Figure 7:
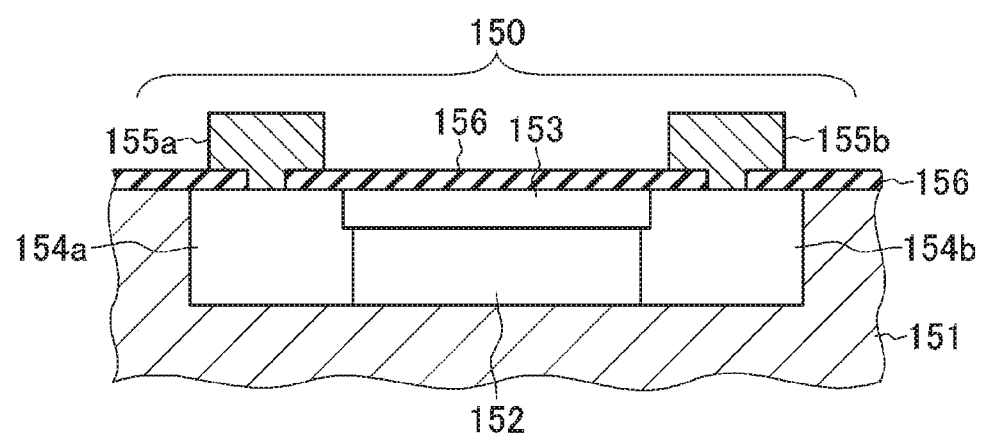
FIG. 7 is a sectional view illustrating a structure of part of the still another pressure sensor according to the embodiment of the present disclosure.

Still another pressure sensor according to the present disclosure will be described below with reference to FIGS. 6 and 7. FIG. 7 illustrates a section taken along a line VII-VII in FIG. 6. This pressure sensor includes a diaphragm 159 formed on a semiconductor layer 151, and a piezo element (measurement portion) 150 that measures stress (distortion) of the diaphragm 159. Pressure applied to the diaphragm 159 is determined by measuring the distortion of the diaphragm 159 with the piezo element 150.

As in the above-described diaphragm 102, the pressure receiving surface of the diaphragm 159 is held in the inactive state. Thus the molecules of the gas to be measured are hard to adsorb onto the pressure receiving surface of the diaphragm 159. The diaphragm 159 is formed to be thinner than the surrounding semiconductor layer 151 and to have a rectangular shape when viewed in plan. That rectangular surface (pressure receiving surface) is held in the inactive state.

The piezo element 150 is arranged in each of four sides of the diaphragm 159. The piezo element 150 includes a piezo resistance region 152, a protective region 153, contact regions 154a and 154b, and electrodes 155a and 155b. The electrodes 155a and 155b are formed on the semiconductor layer 151 with an insulating layer 156 interposed therebetween, and penetrate through the insulating layer 156 to be ohmic-connected to the contact regions 154a and 154b, respectively.

This pressure sensor is a piezo-resistive pressure sensor. Four piezo resistance regions of the four piezo elements 150 are bridge-connected to obtain, as a bridge output, changes of resistance values in the four piezo resistance regions, those changes being caused by a deformation of the diaphragm 159 to which pressure is applied. As a result, the applied pressure can be measured.

The piezo resistance region 152 is a region formed in the semiconductor layer 151 and doped with a p-type impurity. The semiconductor layer 151 is made of silicon, for example. The semiconductor layer 151 is, for example, a portion of a silicon substrate on the surface side. Alternatively, the semiconductor layer 151 may be a surface silicon layer of the well-known SOI (Silicon on Insulator). The piezo resistance region 152 is a p-type region that is formed by doping boron (B), namely a p-type impurity, into the semiconductor layer 151 made of silicon.

The protective region 153 is a region doped with an n-type impurity and formed on the semiconductor layer 151 to cover a space above the piezo resistance region 152. The protective region 153 is an n-type region that is formed by doping phosphorus (P), namely the n-type impurity, into the semiconductor layer 151 made of silicon. It is to be noted that there is a relation of (impurity concentration of the piezo resistance region 152)<(impurity concentration of the protective region 153)<(impurity concentration of the contact regions 154a and 154b).

Furthermore, the protective region 153 covers the entirety of the piezo resistance region 152 when viewed in plan. The protective region 153 has a larger area than the piezo resistance region 152 when viewed in plan. The protective region 153 is formed on the side closer to the surface of the semiconductor layer 151 than the piezo resistance region 152 in a thickness direction of the semiconductor layer 151. The protective region 153 is not always required to be formed in contact with the piezo resistance region 152.

The contact regions 154a and 154b are regions doped with a p-type impurity, the regions being formed to be connected to the piezo resistance region 152 and to reach the surface of the semiconductor layer 151 other than a zone where the protective region is formed. The electrodes 155a and 155b are ohmic-connected to respectively the contact regions 154a and 154b on the surface side of the semiconductor layer 151. The electrodes 155a and 155b are each made of a metal such as Au, Cu or Al.

According to the present disclosure, as described above, since the pressure receiving surface of the diaphragm is held in the inactive state, the influence caused by a deposit on the diaphragm of the pressure sensor can be reduced more reliably.

It is apparent that the present disclosure is not limited to the above-described embodiment, and that various modifications and combinations can be implemented by those persons having ordinary knowledge in the relevant art without departing from the technical concept of the present disclosure.

What is claimed is:

1. A pressure sensor, comprising:
   a diaphragm that is displaceable and receives, at a pressure receiving surface, pressure of a gas to be measured; and
   a measurement portion that measures a displacement of the diaphragm, the measurement portion being located on a side of the diaphragm opposite to the pressure receiving surface,
   wherein the pressure receiving surface of the diaphragm is held in a chemically inactive state by performance of a surface treatment on the pressure receiving surface.

2. The pressure sensor according to claim 1, wherein, after the surface treatment, the pressure receiving surface of the diaphragm is in a state in which molecules of the gas are less likely to be adsorbed on the pressure receiving surface compared to before the surface treatment.

3. The pressure sensor according to claim 1, wherein the pressure receiving surface of the diaphragm is held in the chemically inactive state with layered materials formed on the pressure receiving surface.

4. The pressure sensor according to claim 1, wherein the pressure receiving surface of the diaphragm is held in the chemically inactive state with surface termination molecules formed at the pressure receiving surface.

5. The pressure sensor according to claim 1, wherein the measurement portion includes:
   a movable electrode formed in a movable region of the diaphragm; and
   a fixed electrode formed opposite to the movable electrode; and
   wherein the measurement portion measures the displacement of the diaphragm measuring a capacitance between the movable electrode and the fixed electrode.

6. The pressure sensor according to claim 1, wherein the measurement portion includes a reflective film and a semi-reflective film that are formed in a movable region of the diaphragm and an immovable region opposite to each other, and
   the measurement portion optically measures the displacement of the diaphragm.

7. The pressure sensor according to claim 1, wherein the measurement portion includes piezo resistance regions formed in the diaphragm, and
   the measurement portion measures the displacement of the diaphragm by measuring a distortion of the diaphragm.

8. A pressure sensor, comprising:
a diaphragm that is displaceable and receives, at a pressure receiving surface, pressure of gas to be measured; and
a measurement portion that measures a displacement of the diaphragm,
wherein the pressure receiving surface of the diaphragm is held in a chemically inactive state with surface termination molecules formed on the pressure receiving surface.

\* \* \* \* \*